United States Patent
Ju et al.

(10) Patent No.: US 10,211,074 B2
(45) Date of Patent: Feb. 19, 2019

(54) SUBSTRATE TREATING APPARATUS AND TREATMENT LIQUID NOZZLE

(71) Applicant: Semes Co., Ltd, Cheonan-si, Chungcheongnam-do (KR)

(72) Inventors: Yoon Jong Ju, Cheonan-si (KR); Kihoon Choi, Cheonan-si (KR); Hyeon Jun Lee, Daejeon (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 15/006,359

(22) Filed: Jan. 26, 2016

(65) Prior Publication Data

US 2016/0218022 A1    Jul. 28, 2016

(30) Foreign Application Priority Data

Jan. 28, 2015    (KR) .................... 10-2015-0013698

(51) Int. Cl.
  B08B 3/12    (2006.01)
  H01L 21/67    (2006.01)
  (Continued)

(52) U.S. Cl.
  CPC .... H01L 21/67051 (2013.01); B05B 17/0607 (2013.01); B08B 3/12 (2013.01); *B08B 3/02* (2013.01); *B08B 2203/0288* (2013.01)

(58) Field of Classification Search
  CPC . H01L 21/67051; B08B 3/12; B05B 17/0623; B05B 17/0607
  (Continued)

(56) References Cited

U.S. PATENT DOCUMENTS

| 5,217,165 | A | * | 6/1993 | Takahashi | ........... B05B 17/0615 239/102.2 |
| 6,230,722 | B1 | * | 5/2001 | Mitsumori | ............. B08B 3/022 134/122 R |

(Continued)

FOREIGN PATENT DOCUMENTS

| JP | 08224555 A | * | 9/1996 |
| KR | 10-2004-0107012 A | | 12/2004 |

(Continued)

OTHER PUBLICATIONS

Machine translation of KR 1020040107012 A, dated Dec. 2004.*

*Primary Examiner* — Joseph L. Perrin
*Assistant Examiner* — Kevin G Lee
(74) *Attorney, Agent, or Firm* — Harness, Dickey, & Pierce, P.L.C.

(57) ABSTRACT

Disclosed is a substrate treating apparatus. The substrate treating apparatus includes a housing having a space for treating a substrate in the interior thereof, a spin head which supports and rotates the substrate inside the housing, and an ejection unit having a first nozzle member for ejecting a first treatment liquid onto the substrate positioned on the spin head. The first nozzle member includes a body having an ejection passage, through which the first treatment liquid flows, therein and a first discharge hole communicated with the ejection passage to eject the first treatment liquid onto the substrate, and a vibrator installed in the body to provide vibration for the first treatment liquid flowing through the ejection passage. The vibrator has an interference preventing recess for preventing an interference by reflective waves therein.

17 Claims, 11 Drawing Sheets

(51) Int. Cl.
*B05B 17/06* (2006.01)
*B08B 3/02* (2006.01)

(58) Field of Classification Search
USPC .......................................................... 134/902
See application file for complete search history.

(56) References Cited

U.S. PATENT DOCUMENTS

| | | | | |
|---|---|---|---|---|
| 6,919,669 | B2* | 7/2005 | Bryant | H04R 17/00 310/365 |
| 8,540,169 | B2* | 9/2013 | Kambayashi | A01M 1/205 239/102.1 |
| 2006/0186762 | A1* | 8/2006 | Sugiura | B06B 1/0692 310/328 |
| 2011/0290277 | A1* | 12/2011 | Wang | H01L 21/67051 134/1.3 |
| 2013/0118536 | A1* | 5/2013 | Lee | B08B 3/12 134/115 R |
| 2014/0261586 | A1* | 9/2014 | Sato | H01L 21/67253 134/56 R |
| 2015/0144164 | A1* | 5/2015 | Ishibashi | H01L 21/68792 134/98.1 |

FOREIGN PATENT DOCUMENTS

| | | |
|---|---|---|
| KR | 10-0927029 B1 | 11/2009 |
| KR | 10-1486165 B1 | 1/2015 |
| KR | 10-1536722 B1 | 7/2015 |
| KR | 10-2016-0005824 A | 1/2016 |
| KR | 10-2016-0005826 A | 1/2016 |

* cited by examiner

SUBSTRATE TREATING APPARATUS AND TREATMENT LIQUID NOZZLE

CROSS-REFERENCE TO RELATED APPLICATIONS

A claim for priority under 35 U.S.C. § 119 is made to Korean Patent Application No. 10-2015-0013698 Jan. 28, 2015, in the Korean Intellectual Property Office, the entire contents of which are hereby incorporated by reference.

BACKGROUND

The inventive concept relates to a treatment liquid nozzle and a substrate treating apparatus including the same.

To manufacture a semiconductor device or a liquid crystal display, various processes such as photolithography, etching, ashing, ion implantation, and thin film deposition are performed on a substrate. To eliminate foreign substances and particles produced in the processes, a cleaning process of cleaning the substrate is carried out before or after each process.

For the cleaning process, various methods of ejecting chemicals, ejecting a treatment liquid mixed with gases, or ejecting a treatment liquid provided with vibration are used to eliminate foreign substances and particles on a substrate.

Among them, the method of ejecting a treatment liquid by using vibration has an advantage of variously adjusting the particle sizes of the treatment liquid. The treatment liquid, of which the particle sizes are adjusted, weakens attachment forces of residual foreign substances and particles on a substrate or eliminates the foreign substances and particles. Then, when distances which reflective waves of transverse waves reach are constant, a vibrator causes an abnormal output phenomenon due to a resistance of not less than a threshold value.

SUMMARY

The inventive concept provides a substrate treating apparatus that improves cleaning efficiency.

The problems that are to be solved by the inventive concept are not limited to the above-mentioned problems, and the unmentioned problems will be clearly understood by those skilled in the art to which the inventive concept pertains from the specification and the accompanying drawings.

The inventive concept provides a substrate treating apparatus.

According to an embodiment of the inventive step, the substrate treating apparatus may include a housing having a space for treating a substrate in the interior thereof, a spin head which supports and rotates the substrate inside the housing, and an ejection unit having a first nozzle member for ejecting a first treatment liquid onto the substrate positioned on the spin head. The first nozzle member may include a body having an ejection passage, through which the first treatment liquid flows, therein and a first discharge hole communicated with the ejection passage to eject the first treatment liquid onto the substrate, and a vibrator installed in the body to provide vibration for the first treatment liquid flowing through the ejection passage. The vibrator has an interference preventing recess for preventing an interference by reflective waves therein.

The interference preventing recess may be formed at a central portion of the vibrator.

The interference preventing recess may have a polygonal shape.

The vibrator may be a piezoelectric element.

The vibrator may have a polygonal shape.

The ejection unit may further include a second nozzle member for ejecting a second treatment liquid onto the substrate.

The first treatment liquid may be a cleaning liquid, and the second treatment liquid may be a mixture solution containing ammonia and hydrogen peroxide.

According to an embodiment of the inventive concept, a substrate treating apparatus having an improved cleaning efficiency can be provided.

The effects of the inventive concept are not limited to the above-mentioned effects, and the unmentioned effects can be clearly understood by those skilled in the art to which the inventive concept pertains from the specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
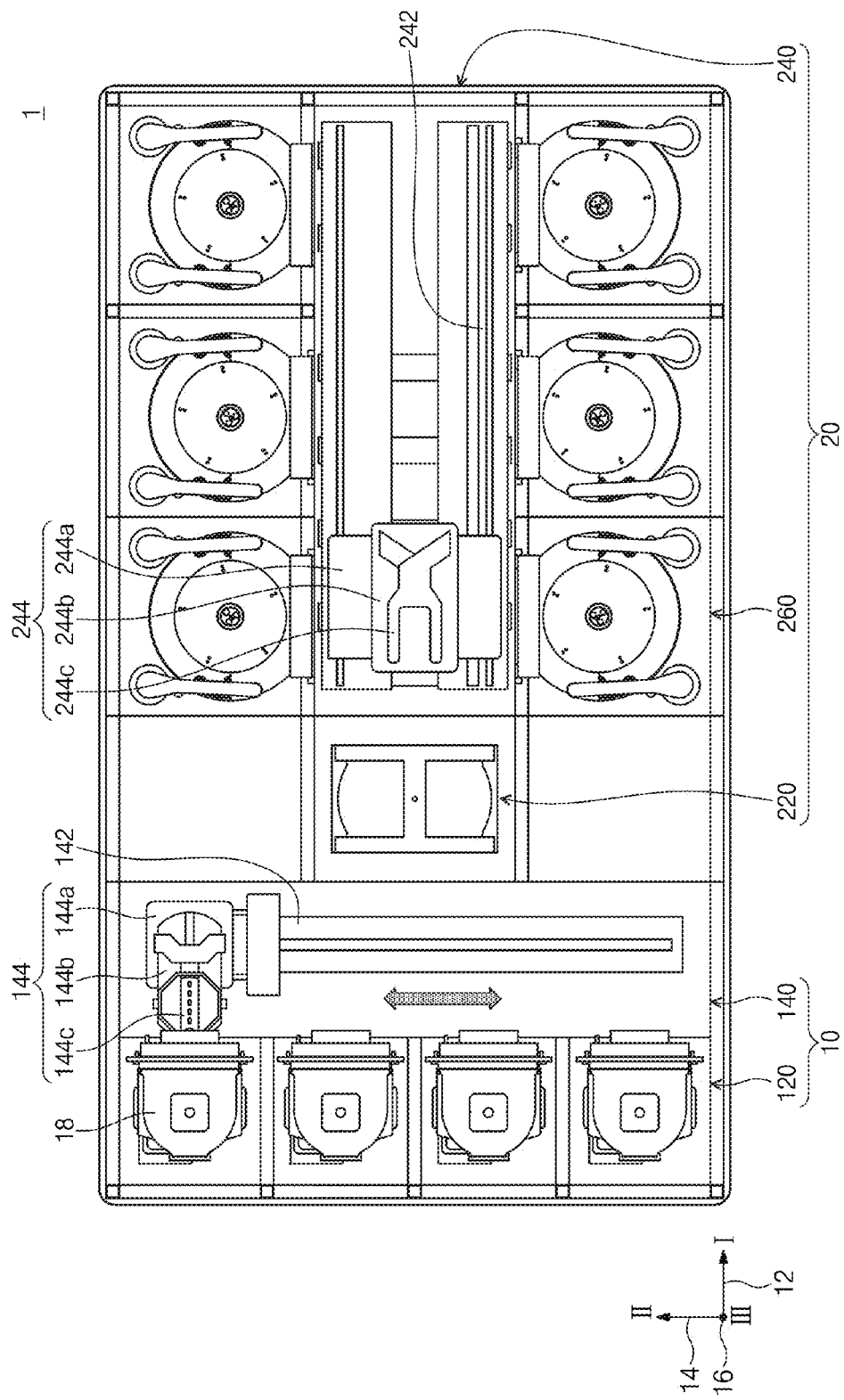
FIG. 1 is a plan view schematically illustrating a substrate treating system.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, exemplary embodiments of the inventive concept will be described with reference to FIGS. 1 to 14.

FIG. 1 is a plan view schematically illustrating a substrate treating system according to the inventive concept. Referring to FIG. 1, the substrate treating system 1 includes an index module 10 and a process treating module 20. The index module 10 includes a plurality of load ports 120 and a feeding frame 140. The load ports 120, the feeding frame 140, and the process treating module 20 may be sequentially arranged in a row. Hereinafter, a direction in which the load ports 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 130, in which a substrate W is received, is seated on the load port 120. A plurality of load ports 120 are provided, and are arranged along the second direction 14 in a row. The number of the load ports 120 may be increased or decreased according to the process efficiency of the process treating module 20, a footprint condition, and the like. A plurality of slots (not illustrated) for receiving substrates W while the substrates W are arranged in parallel to the ground surface are formed in the carrier 130. A front opening unified pod (FOUP) may be used as the carrier 130.

The process treating module 20 includes a buffer unit 220, a feeding chamber 240, and a plurality of process chambers 260. The feeding chamber 240 is disposed such that the lengthwise direction thereof is in parallel to the first direction 12. The process chambers 260 are arranged on opposite sides of the feeding chamber 240. The process chambers 260 are provided on the opposite sides of the feeding chamber 240 to be symmetrical to each other with respect to the feeding chamber 240. A plurality of process chambers 260 are arranged on one side of the feeding chamber 240. Some of the process chambers 260 are arranged along the lengthwise direction of the feeding chamber 240. Furthermore, some of the process chambers 260 are arranged to be stacked on each other. That is, the process chambers 260 constituting an array of A by B may be arranged on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be arranged in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is disposed between the feeding frame 140 and the feeding chamber 240. The buffer unit 220 provides a space in which the substrates W stay before being transported, between the feeding chamber 240 and the feeding frame 140. A plurality of slots (not illustrated) in which the substrates W are positioned are provided in the interior of the buffer unit 220. A plurality of slots (not illustrated) may be provided to be spaced apart from each other along the third direction 16. A face of the buffer unit 220 that faces the feeding frame 140 and a face of the buffer unit 220 that faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is disposed such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are arranged to be stacked so as to be spaced apart from each other along the third direction 16. Some of the index arms 144c are used when the substrates W are transported to the carrier 130 in the process module 20, and some of the index arms 144c may be used when the substrates W are transported from the carrier 130 to the process treating module 20. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is disposed such that the lengthwise direction thereof is in parallel to the first direction 12. The main robot 244 is installed on the guide rail 242, and is linearly moved along the first direction 12 on the guide rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are arranged to be stacked so as to be spaced apart from each other along the third direction 16.

Substrate treating apparatuses 300 that perform cleaning processes on the substrates W are provided in the process chambers 260. The substrate treating apparatus 300 may have different structures according to the types of the cleaning processes. Alternatively, the substrate treating apparatuses 300 in the process chambers 260 may have the same structure. Selectively, the process chambers 260 may be classified into a plurality of groups such that the structures of the substrate treating apparatuses 300 in the process chambers pertaining to the same group are the same and the structures of the substrate treating apparatuses 300 in the process chambers pertaining to different groups are different.

Figure 2:
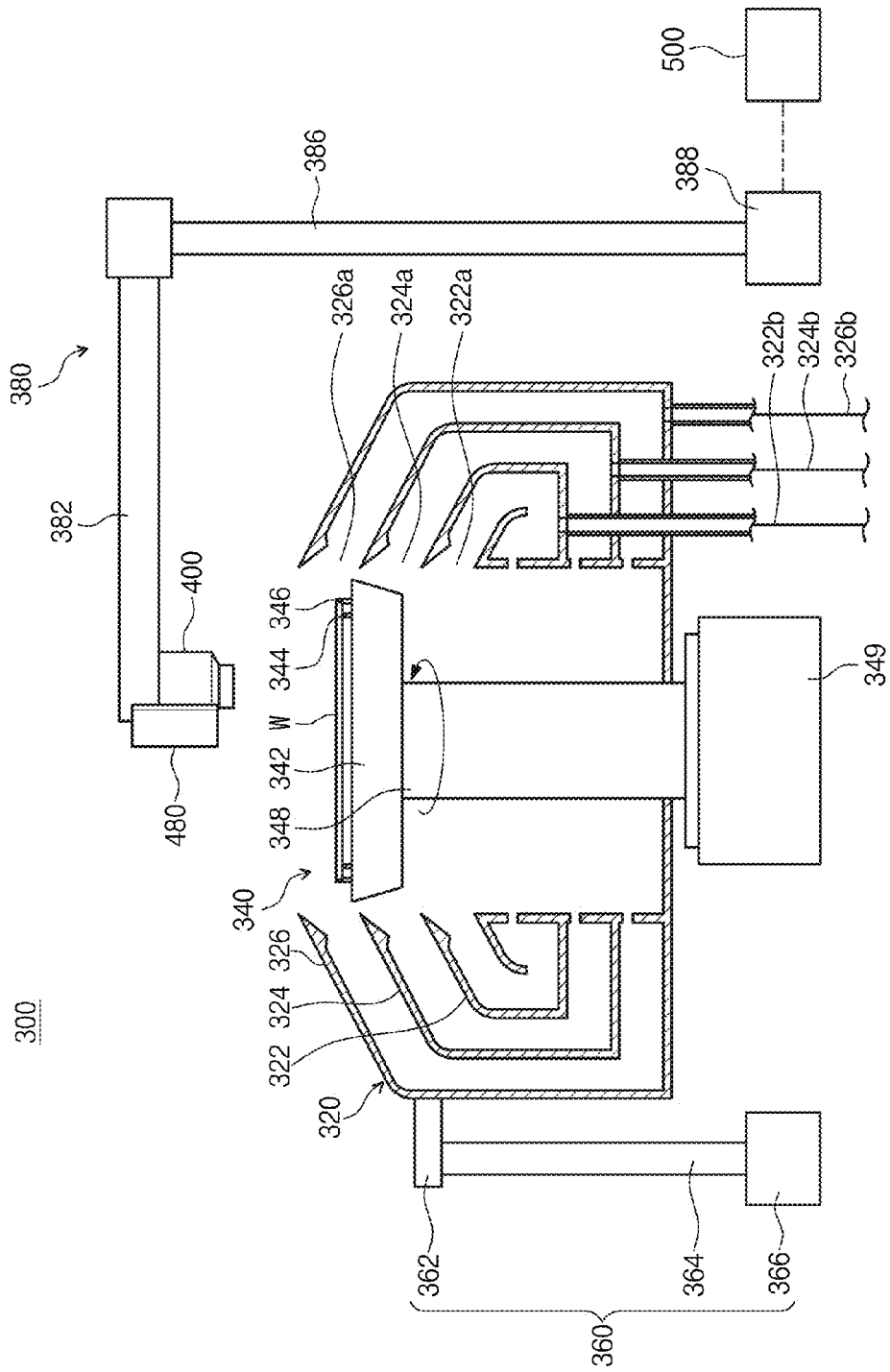
FIG. 2 is a sectional view illustrating a substrate treating apparatus of FIG. 1.

FIG. 2 is a sectional view illustrating a substrate treating apparatus of FIG. 1. Referring to FIG. 2, the substrate treating apparatus 300 includes a housing 320, a spin head 340, an elevation unit 360, and an ejection unit 380. The housing 320 has a space for performing a substrate treating process, and an upper side of the housing 320 is opened. The housing 320 has an inner recovery vessel 322 and an outer recovery vessel 326. The recovery vessels 322 and 326 recover different treatment liquids used in the process. The inner recovery vessel 322 is provided to have an annular ring shape that surrounds the spin head 340, and the outer recovery vessel 326 is provided to have an annular ring shape that surrounds the inner recovery vessel 322. An interior space 322a of the inner recovery vessel 322 and a space 326a between the inner recovery vessel 322 and the outer recovery vessel 326 function as inlets through which the treatment liquid is introduced into the inner recovery vessel 322 and the outer recovery vessel 326. Recovery lines 322b and 326b extending from the recovery vessels 322 and 326 perpendicularly in the downward direction of the bottom surfaces thereof are connected to the recovery vessels 322 and 326, respectively. The recovery lines 322b and 326b discharge the treatment liquids introduced through the recovery vessels 322 and 326, respectively. The discharged treatment liquids may be reused through an external treatment liquid recycling system (not illustrated).

The spin head 340 supports and rotates the substrate W during the process. The spin head 340 has a body 342, a plurality of support pins 344, a plurality of chuck pins 346, and a support shaft 348. The body 342 has an upper surface having a substantially circular shape when viewed from the top. The support shaft 348 that may be rotated by a motor 349 is fixedly coupled to the bottom of the body 342.

A plurality of support pins 344 are provided. The support pins 344 may be arranged to be spaced apart from each other at a periphery of the upper surface of the body 342 and protrude upwards from the body 342. The support pins 344 are arranged to have a generally annular ring shape through combination thereof. The support pins 344 support a periphery of a rear surface of the substrate W such that the substrate W is spaced apart from the upper surface of the body 342 by a predetermined distance.

A plurality of chuck pins 346 are provided. The chuck pins 346 are arranged to be more distant from the center of the body 342 than the support pins 344. The chuck pins 346 are provided to protrude upwards from the body 342. The chuck pins 346 support a side of the substrate W such that the substrate W is not separated laterally from a proper place when the spin head 340 is rotated. The chuck pins 346 are provided to be linearly moved between a standby position and a support position along a radial direction of the body 342. The standby position is a position that is more distant from the center of the body 342 than the support position. When the substrate W is loaded on or unloaded from the spin head 340, the chuck pins 346 are located at the standby position, and when a process is performed on the substrate W, the chuck pins 346 are located at the support position. The chuck pins 346 are in contact with the side of the substrate W at the support position.

The elevation unit 360 linearly moves the housing 320 upwards and downwards. When the housing 320 is moved upwards and downwards, a relative height of the housing 320 to the spin head 340 is changed. The elevation unit 360 has a bracket 362, a movable shaft 364, and a driver 366. The bracket 362 is fixedly installed on an outer wall of the housing 320, and the movable shaft 364 that is moved upwards and downwards by the driver 366 is fixedly coupled to the bracket 362. When the substrate W is positioned on the spin head 340 or is lifted from the spin head 340, the housing 320 is lowered such that the spin head 340 protrudes to the upper side of the housing 320. When the process is performed, the height of the housing 320 is adjusted such that the treatment liquid are introduced into the preset recovery vessel 360 according to the kind of the treatment liquid supplied to the substrate W. Selectively, the elevation unit 360 may move the spin head 340 upwards and downwards.

The ejection unit 380 ejects the treatment liquid onto the substrate W. A plurality of ejection units 380 may be provided to eject various kinds of treatment liquids or the same kind of treatment liquid in various methods. The ejection unit 380 includes a support shaft 386, a nozzle arm 382, a first nozzle member 400, a cleaning member 470, and a second nozzle member 480. The support shaft 386 is disposed on one side of the housing 320. The support shaft 386 has a rod shape, of which a lengthwise direction is a vertical direction. The support shaft 386 is swung and elevated by the driver member 388. Unlike this, the support shaft 386 may be linearly moved horizontally and elevated by the driver member 388. The nozzle arm 382 is fixedly coupled to an upper end of the support shaft 386. The nozzle arm 382 supports the first nozzle member 400 and the second nozzle member 480. The first nozzle member 400 and the second nozzle member 480 are situated at an end of the nozzle arm 382. For example, the second nozzle member 480 may be situated closer to the end of the nozzle arm 382 than the first nozzle member 400. The cleaning member 470 cleans the first nozzle member 400. The cleaning member 470 is provided on one side of the interior of the housing 320. When a first treatment liquid is discharged from the first nozzle member 400 onto the substrate, a controller 500 locates the first nozzle member 400 to a discharge position that is an upper side of the substrate. Meanwhile, if the treatment liquid is completely discharged, the controller 500 locates the first nozzle member 400 to a cleaning position inside a liquid vessel 472.

The first nozzle member 400 is provided to have a circular shape when viewed from the top. The first nozzle member 400 ejects the first treatment liquid in an inkjet manner. The first nozzle member 400 includes bodies 410 and 430, a vibrator 436, a treatment liquid supply line 450, and a treatment liquid recovery line 460. The first nozzle member 400 ejects the first treatment liquid in an inkjet manner.

Figure 4:
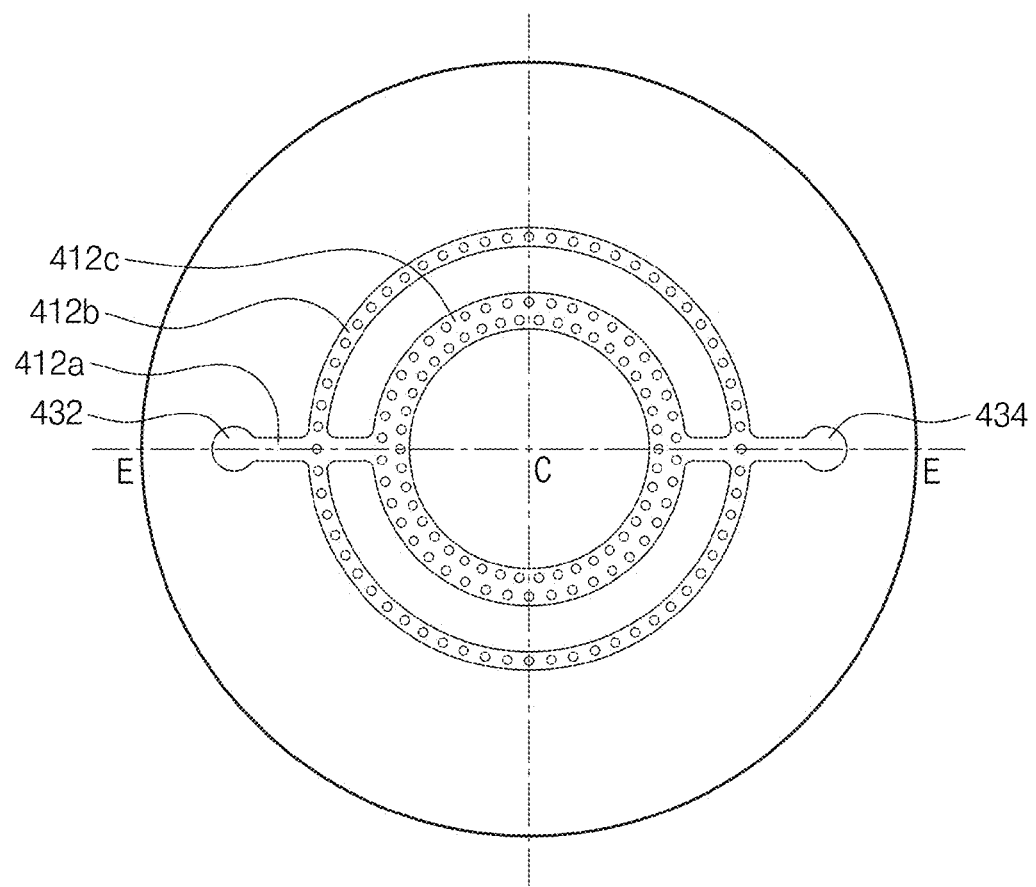
FIG. 4 is a bottom view illustrating the vibrator of FIG. 3.

The body 410 and 430 has a lower plate 410 and an upper plate 430. The lower plate 410 has a cylindrical shape. An ejection passage 412, through which the treatment liquid flows, is formed in the interior of the lower plate 410. The ejection passage 412 connects an introduction passage 432 and a recovery passage 434. A plurality of first discharge holes 414, through which the first treatment liquid is ejected, are formed on the bottom surface of the lower plate 410, and the first discharge holes 414 are communicated with the ejection passage 412. The first discharge holes 414 may be fine holes. The ejection passage 412 may have a first area 412b, a second area 412c, and a third area 412a. When viewed from the top, the first area 412b and the second area 412c have ring shapes. The radius of the first area 412b is larger than the radius of the second area 412c. The first discharge holes 414 of the first area 412b may be provided in a row along the first area 412b. The first discharge holes 414 of the second area 412c may be provided in two rows along the second area 412c. The third area 412a connects the first area 412b and the second area 412c to an introduction passage 432. The third area 412a connects the first area 412b and the second area 412c to a recovery passage 434. For example, as illustrated in FIG. 4, the third area 412a may be connected to the introduction passage 432 or the recovery passage 434. The upper plate 430 has a cylindrical shape having the same diameter as that of the lower plate 410. The upper plate 430 is fixedly coupled to the upper surface of the lower plate 410. The introduction passage 423 and the recovery passage 434 are formed in the interior of the upper plate 430. The introduction passage 432 and the recovery passage 434 are communicated with the second area 412b of the ejection passage 412. The introduction passage 432 functions as an inlet through which the first treatment liquid is introduced into the ejection passage 412, and the recovery passage 434 functions as an outlet through which the first treatment liquid is recovered from the ejection passage 412. The introduction passage 432 and the recovery passage 434 are situated to face each other with respect to the center of the first nozzle member 400. Selectively, the ejection passage may have another shape.

The vibrator 436 is situated in the interior of the upper plate 430. When viewed from the top, the vibrator 436 has a disk shape. For example, the vibrator 436 has the same diameter as that of the first area 412b. Selectively, the diameter of the vibrator 436 may be larger than the diameter of the first area 412b and smaller than the diameter of the upper plate 430. The vibrator 436 is electrically connected to a power source 438 situated on the outside. The vibrator 436 provides vibration for the ejected treatment liquid to control the size of particles and the flow rate of the first treatment liquid. According to an embodiment of the inventive concept, the vibrator 436 may be a piezoelectric element. The first treatment liquid is provided as a cleaning liquid. For example, the first treatment liquid may be electrolyzed water. The first treatment water may include any one or all of hydrogen water, oxygen water, ozone water. Selectively, the first treatment liquid may be pure water.

Figure 3:
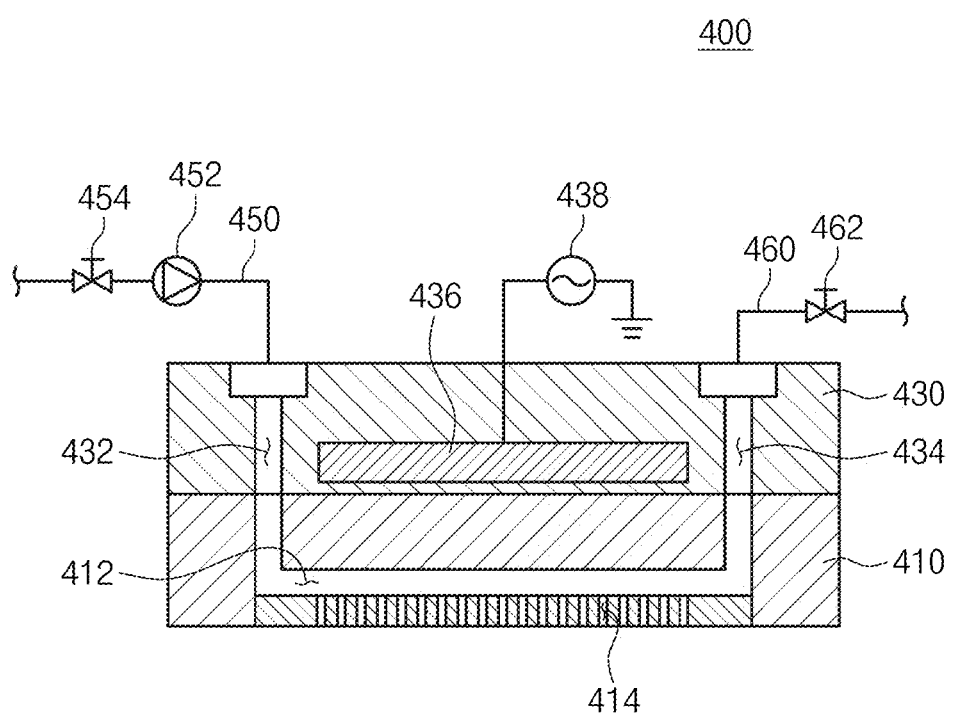
FIG. 3 is a sectional view illustrating a vibrator of FIG. 2 according to the related art.
Figure 5:
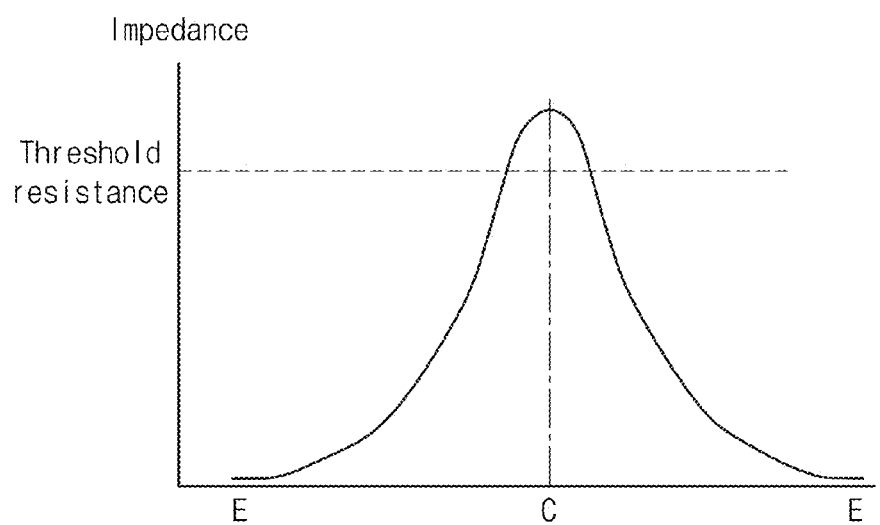
FIGS. 5 and 6 illustrate impedances according to the vibrator of FIG. 2.
Figure 6:
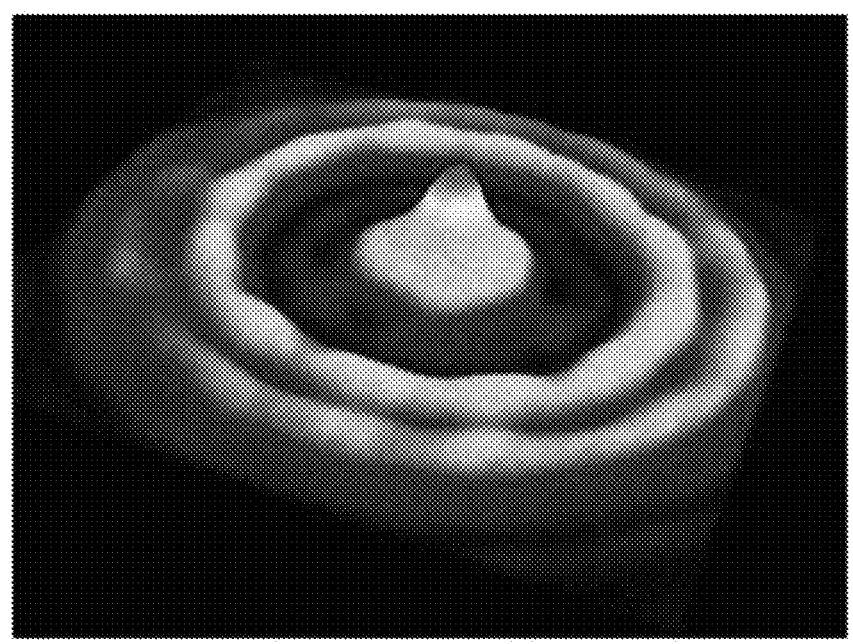

FIG. 3 is a sectional view illustrating a vibrator 436 of FIG. 2 according to the related art. FIG. 4 is a bottom view illustrating the vibrator 436 of FIG. 3. FIGS. 5 and 6 illustrate impedances according to the vibrator 436 of FIG. 2. The vibrator 436 according to the related art has a circular shape. Hereinafter, the vibrator 436 will be described as a piezoelectric element 436. Then, because a single piezoelectric element 436 controls several frequencies, a peak negative pressure is generated at a specific frequency due to resonance. That is, currents are saturated. Accordingly, a control of droplets discharged through the discharge holes may become abnormal. Further, due to the reflective waves by transverse waves, a distance which the reflective waves reach may be constant at a central area C of the piezoelectric element 436. Accordingly, a phenomenon in which the impedance of the piezoelectric element 436 exceeds a threshold resistance occurs at the central area C of the piezoelectric element 436. Accordingly, an abnormal output may occur at a central portion of the piezoelectric element 436.

Figure 7:
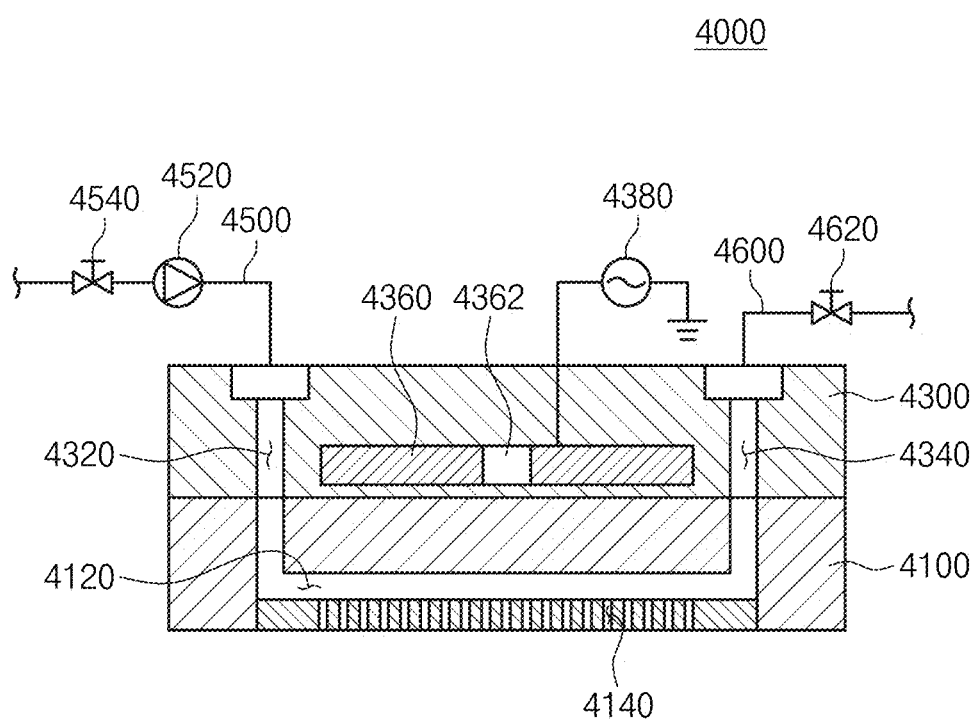
FIG. 7 is a sectional view illustrating a vibrator according to an embodiment of the inventive concept.
Figure 8:
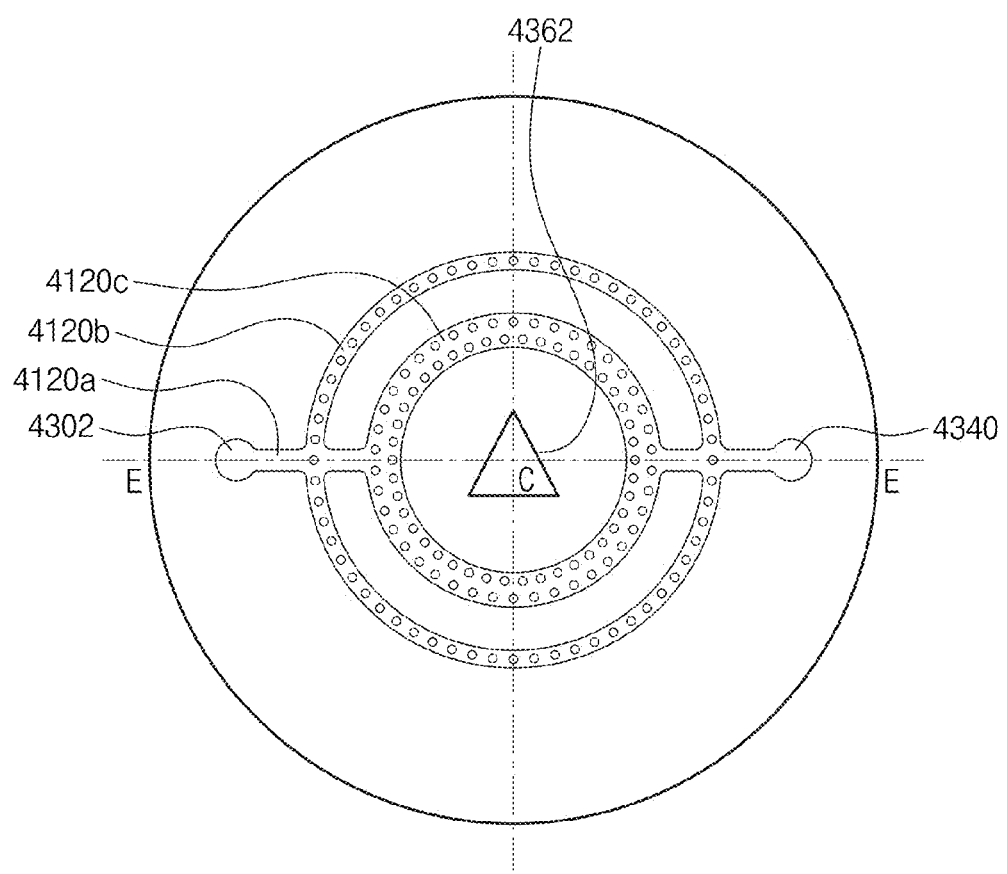
FIG. 8 is a bottom view illustrating the vibrator of FIG. 7.
Figure 9:
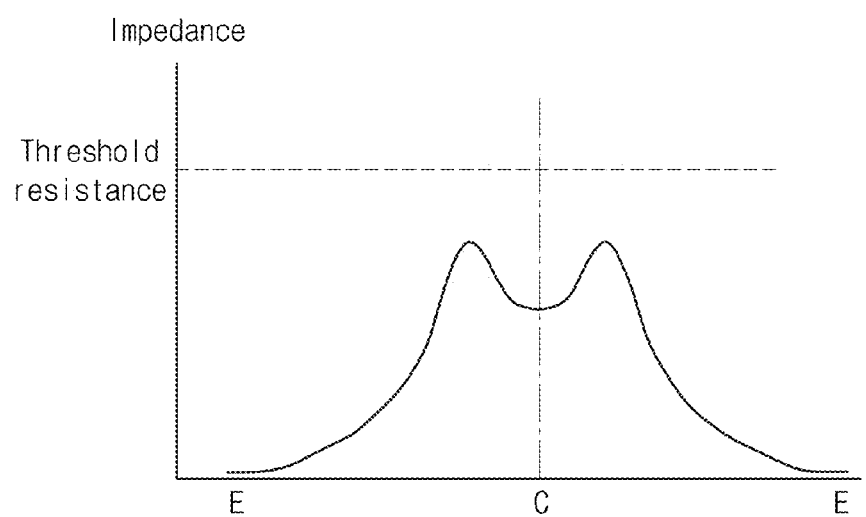
FIGS. 9 and 10 illustrate impedances according to the vibrator of FIG. 7.
Figure 10:
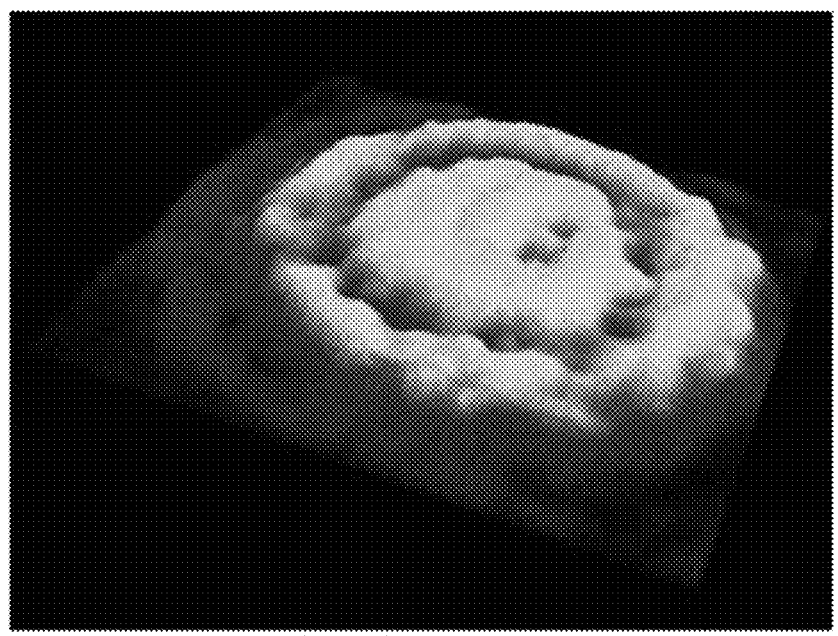
Figure 11:
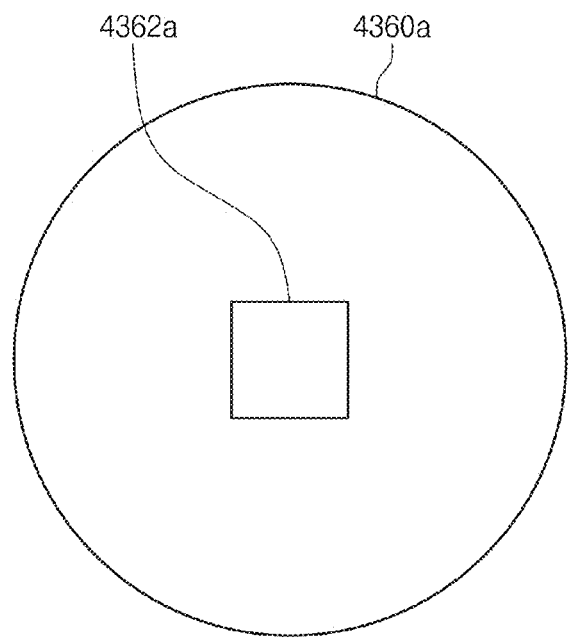
FIG. 11 is a view illustrating a piezoelectric element according to another embodiment of the inventive concept.
Figure 12:
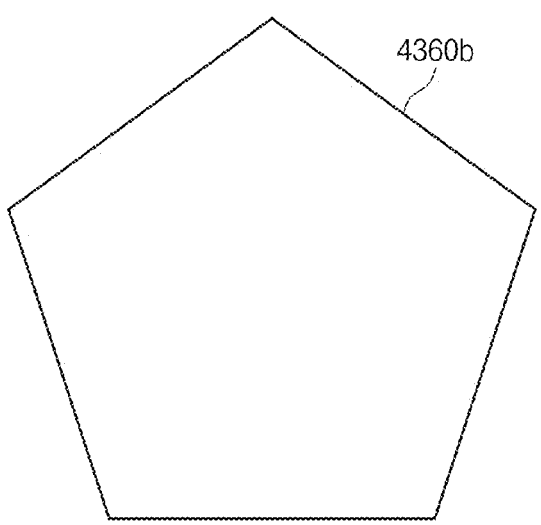
FIG. 12 is a view illustrating a piezoelectric element according to another embodiment of the inventive concept.
Figure 13:
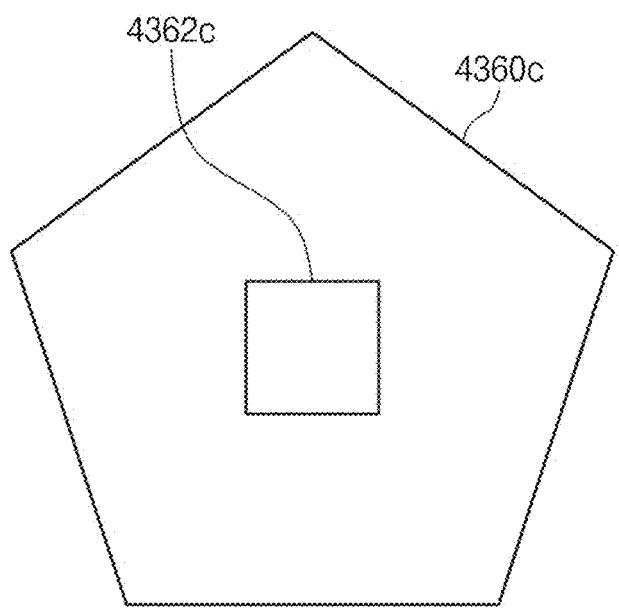
FIG. 13 is a view illustrating a piezoelectric element according to another embodiment of the inventive concept.
Figure 14:
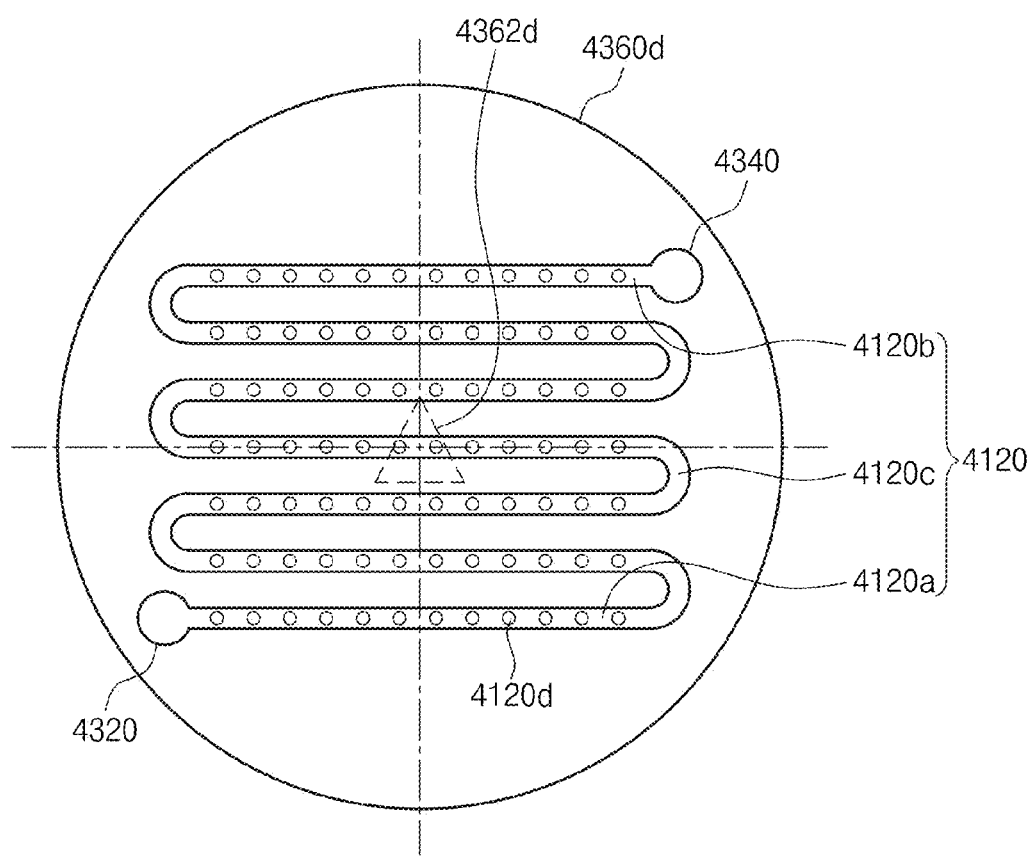
FIG. 14 is a view illustrating a piezoelectric element according to another embodiment of the inventive concept.

FIG. 7 is a sectional view illustrating a vibrator 4360 according to an embodiment of the inventive concept. FIG. 8 is a bottom view illustrating the vibrator 4360 of FIG. 7. FIGS. 9 and 10 illustrate impedances according to the vibrator 4360 of FIG. 7. FIG. 11 is a view illustrating a piezoelectric element 4360a according to another embodiment of the inventive concept. FIG. 12 is a view illustrating a piezoelectric element 4360b according to another embodiment of the inventive concept. FIG. 13 is a view illustrating a piezoelectric element 4360c according to another embodiment of the inventive concept. FIG. 14 is a view illustrating a piezoelectric element 4360d according to another embodiment of the inventive concept. Hereinafter, the vibrator 4360 will be described as a piezoelectric element 4360. The piezoelectric element 4360 has an interference preventing recess 4362 in the interior thereof. The interference preventing recess 4362 prevents an interference by reflective waves. The interference preventing recess 4362 may be formed at a central area C of the piezoelectric element 4360. The interference preventing recess 4362 may have a polygonal shape. For example, as illustrated in FIG. 8, the interference preventing recess 4362 may have a triangular shape. However, the interference preventing recess 4362 should not be circular. The circular shape is avoided to prevent an interference at a central area C the piezoelectric element 4360 between reflective waves by transverse waves. Due to the interference preventing recess 4362, the distance which the reflective waves reach is changed such that the peak is dispersed, and the impedance value at the central area of the piezoelectric element 4360 may be stabilized. Accordingly, a current saturation phenomenon can be prevented, and an output control stability of the piezoelectric element 4360 can be increased.

Unlike this, as illustrated in FIG. 11, the piezoelectric element 4360a may have an interference preventing recess having other various shapes. Selectively, as illustrated in FIG. 12, the piezoelectric element 4360b may have a polygonal shape instead of a circular shape. As illustrated in FIG. 13, the polygonal piezoelectric element 4360c may have an interference preventing recess 4362c. The piezoelectric element 4360d having the interference preventing recess 4362d may have an ejection passage of various shapes while the shape of the ejection passage is not limited. For example, the ejection passage 4120 has a first ejection passage 4120a, a second ejection passage 4120b, and a third ejection passage 4120c. The first ejection passage 4120a extends from the introduction passage 4320. The first ejection passage 4120a may have a first length L1. The second ejection passage 4120b extends from the recovery passage 4340. The second ejection passage 4120b is provided in parallel to the first ejection passage 4120a. The second ejection passage 4120b may have a first length L1. The third ejection passage 4120c connects the first ejection passage 4120a and the second ejection passage 4120b. The third ejection passage 4120c is curved. A portion of the third ejection passage 4120c may be parallel to the first ejection passage 4120a and may have a first length L1. For example, as illustrated in FIG. 14, the third ejection passage 4120c may be provided to have a shape in which a plurality of U shapes are connected to each other. Selectively, the third ejection passage 4120c may have various shapes. The introduction passage 4320 and the recovery passage 4340 may correspond to each other with respect to the center of the first nozzle member 400. Then, the ejection passage 4120 may be formed at a uniform interval in a rectangular area in which a linear distance between the introduction passage 4320 and the recovery passage 4340 corresponds to a diagonal line thereof.

The treatment liquid supply line 450 supplies the first treatment liquid to the introduction passage 432, and the treatment liquid recovery line 460 recovers the first treatment liquid from the recovery passage 434. The treatment liquid supply line 450 is connected to the introduction passage 432, and the treatment liquid recovery line 460 is connected to the recovery passage 434. A pump 452 and a supply valve 454 are installed on the treatment liquid supply line 450. A recovery valve 462 is installed on the treatment liquid recovery line 460. The pump 452 pressurizes the first treatment liquid supplied from the treatment liquid supply line 450 to the introduction passage 432. As the pump 452 is operated, the first treatment liquid may be supplied into the bodies 410 and 430. The supply valve 454 opens and closes the treatment liquid supply line 450. Hereinafter, the supply valve 454 will be referred to as a first valve 450a. The recovery valve 462 opens and closes the treatment liquid recovery line 460. According to an embodiment of the inventive concept, when the process is in a standby state, the recovery valve 462 opens the treatment liquid recovery line 460. Accordingly, the first treatment liquid is recovered through the treatment liquid recovery line 460, and is not ejected through the first ejection holes 414. Differently, while the process is performed, the recovery valve 462 closes the treatment liquid recovery line 460. Accordingly, the ejection passage 412 is filled with the first treatment liquid and the internal pressure of the ejection passage 412 increases, and if an electric voltage is applied to the vibrator 436, the first treatment liquid may be ejected through the first ejection holes 414.

Referring back to FIG. 2, the second nozzle member 480 supplies the second treatment liquid onto the substrate. The second nozzle member 480 supplies the second treatment liquid at the same time when the first nozzle member 400 supplies the first treatment liquid. Then, the second nozzle member 480 supplies the second treatment liquid first before the first nozzle member 400 supplies the first treatment liquid. For example, the second nozzle member 480 may eject the second treatment liquid in a drop manner. The second nozzle member 480 surrounds a portion of the first nozzle member 400. The second nozzle member 480 is provided adjacent to one end of the nozzle arm 382 than the first nozzle member 400. The second nozzle member 480 has a second discharge hole 482, through which the second treatment liquid is discharged onto the substrate perpendicularly to the substrate. The second nozzle member 480 has an arc shape that surrounds the first nozzle member 400 when viewed from the top. The linear distance from one end of the second nozzle member 480 to an opposite end of the second nozzle member 480 is longer than the diameter of the first nozzle member 400. Then, the first nozzle member 400 and the second nozzle member 480 may be concentric. The second treatment liquid is provided as a protection liquid. For example, the liquid may be a solution containing ammonia and hydrogen peroxide. The second treatment liquid forms a liquid film on the substrate W, and the liquid film alleviates an impact applied to the substrate W by the first treatment liquid. Accordingly, the pattern on the substrate W can be prevented from being fallen by the first treatment liquid. The second treatment liquid may be pure water. The second discharge hole may have a single slit shape. Selectively, the second discharge hole 482 may have a plurality of circular discharge holes. The second nozzle member 480 may eject the second treatment liquid to an area adjacent to the area of the substrate W, to which the first treatment liquid is ejected. The area, to which the second treatment liquid is ejected, may be closer to a central area of the substrate W than the area, to which the first treatment liquid is ejected. Selectively, the second nozzle member 480 may have a bar shape instead of an arc shape.

The above-described substrate treating apparatus may be used in various processes in addition to a substrate cleaning process. For example, it may be used in a substrate etching process. Further, the substrate treating apparatus may include a separate rinsing liquid member. Furthermore, although it has been described that the second nozzle member according to the embodiment of the inventive concept surrounds a portion of the first nozzle member, the second nozzle member may have another different shape.

The inventive concept may be variously corrected, replaced, and modified by those skilled in the art to which the inventive concept pertains without departing from the technical spirit of the inventive concept, and accordingly it is noted that the inventive concept is not limited to the above-described embodiments and the accompanying drawings. In addition, the embodiments of the inventive concept that have been described in the specification are not applied in a limited way, but all or some of the embodiments may be selectively combined so that various modifications can be made.

What is claimed is:

1. A substrate treating apparatus, comprising:
   a housing including a space for a substrate;
   a spin head which supports and rotates the substrate inside the housing; and
   an ejection unit having a first nozzle member for ejecting a first treatment liquid onto the substrate on the spin head,
   wherein the first nozzle member comprises,
   a body having an ejection passage, through which the first treatment liquid is configured to flow, therein and a first discharge hole with the ejection passage configured to eject the first treatment liquid onto the substrate, and
   a vibrator including a non-circular recess in an interior of the vibrator, the vibrator installed in the body to provide vibration for the first treatment liquid flowing through the ejection passage without causing constructive interference of the treatment liquid in a center of the vibrator, a shape of the recess being different from a shape of the vibrator.

2. The substrate treating apparatus of claim 1, wherein the non-circular recess is at a central portion of the vibrator.

3. The substrate treating apparatus of claim 2, wherein the non-circular recess has a polygonal shape.

4. The substrate treating apparatus of claim 3, wherein the vibrator is a piezoelectric element.

5. The substrate treating apparatus of claim 1, wherein the vibrator has a polygonal shape.

6. The substrate treating apparatus of claim 1, wherein the ejection unit further comprises:
   a second nozzle member configured to eject a second treatment liquid onto the substrate.

7. The substrate treating apparatus of claim 6, wherein the first treatment liquid is a cleaning liquid, and the second treatment liquid is a mixture solution including ammonia and hydrogen peroxide.

8. The substrate treating apparatus of claim 1, wherein the first nozzle member is circular.

9. A treatment liquid nozzle configured to supply a treatment liquid to a target treatment body and comprising:
   a vibrator including a non-circular interference-preventing recess in an interior of the vibrator, the vibrator configured to provide vibration with the treatment liquid without causing constructive interference of the treatment liquid in a center of the vibrator, a shape of the recess being different from a shape of the vibrator.

10. The treatment liquid nozzle of claim 9, wherein the non-circular recess is at a central portion of the vibrator.

11. The treatment liquid nozzle of claim 10, wherein the non-circular recess has a polygonal shape.

12. The treatment liquid nozzle of claim 11, wherein the vibrator is a piezoelectric element.

13. The treatment liquid nozzle of claim 9, wherein the vibrator has a polygonal shape.

14. The treatment liquid nozzle of claim 9, wherein the treatment liquid nozzle is circular.

15. A treatment liquid nozzle configured to supply a treatment liquid to a target treatment body and comprising:
   a vibrator for providing vibration with the treatment liquid without causing constructive interference of the treatment liquid in a center of the vibrator, wherein the vibrator has a polygonal shape of more than four sides when viewed in plan view, the vibrator including a recess, a shape of the recess being different from a shape of the vibrator.

16. The treatment liquid nozzle of claim 15, wherein the vibrator is a piezoelectric element.

17. The treatment liquid nozzle of claim 15, wherein the treatment liquid nozzle is circular.

\* \* \* \* \*